United States Patent [19]

Shimizu et al.

[11] Patent Number: 5,459,010

[45] Date of Patent: Oct. 17, 1995

[54] PHOTOSENSITIVE COMPOSITION COMPRISING A POLYMER HAVING A 4-HYDROXYBUTYL(METH)ACRYLATE MONOMER IN A MIXTURE WITH A DIAZO COMPOUND

[75] Inventors: Shigeki Shimizu, Atsugi; Youichiro Tsuji, Yokohama, both of Japan

[73] Assignee: Mitsubishi Chemical Corporation, Tokyo, Japan

[21] Appl. No.: 317,773

[22] Filed: Oct. 4, 1994

[30] Foreign Application Priority Data

Jul. 4, 1991 [JP] Japan .................. 3-164711

[51] Int. Cl.⁶ .................. G03F 7/021; G03F 7/033
[52] U.S. Cl. .................. 430/175; 430/157; 430/176; 430/281; 430/288; 430/302; 430/906; 430/910
[58] Field of Search .................. 430/175, 176, 430/281, 288, 910, 906, 302, 157

[56] References Cited

U.S. PATENT DOCUMENTS

| | | | |
|---|---|---|---|
| 4,123,276 | 10/1978 | Kita et al. | 430/176 |
| 4,172,729 | 10/1979 | Naritomi et al. | 430/175 |
| 4,192,684 | 3/1980 | Gensho et al. | 430/284 |
| 4,275,138 | 6/1981 | Kita et al. | 430/157 |
| 4,293,635 | 10/1981 | Flint et al. | 430/271 |
| 4,294,905 | 10/1981 | Okishi et al. | 430/910 |
| 4,555,473 | 11/1985 | Dueber et al. | 430/910 |
| 4,717,643 | 1/1988 | Scheve et al. | 430/910 |

FOREIGN PATENT DOCUMENTS

| | | |
|---|---|---|
| 0194440 | 9/1986 | European Pat. Off. . |
| 0366077 | 5/1990 | European Pat. Off. . |

OTHER PUBLICATIONS

Patent Abstracts of Japan, vol. 11, No. 253, (P–606)(2700), Aug. 18, 1987, & JP–A–62–59948, Mar. 16, 1987, Y. Maeda, et al., "Photosensitive Composition".

*Primary Examiner*—John S. Y. Chu
*Attorney, Agent, or Firm*—Oblon, Spivak, McClelland, Maier & Neustadt

[57] ABSTRACT

A photosensitive composition comprising a photosensitive material and a polymer, wherein the polymer comprises from 2 to 50 mol % of hydroxyalkyl (meth)acrylate units, of which the main component is units of a hydroxyalkyl (meth)acrylate of the following formula (I):

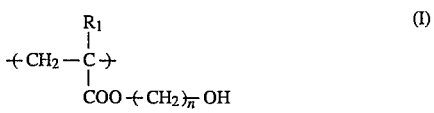

wherein $R_1$ is a hydrogen atom or a methyl group, and n is an integer of from 3 to 10.

4 Claims, No Drawings

PHOTOSENSITIVE COMPOSITION COMPRISING A POLYMER HAVING A 4-HYDROXYBUTYL(METH)ACRYLATE MONOMER IN A MIXTURE WITH A DIAZO COMPOUND

This application is a continuation of application Ser. No. 07/907,636, filed on Jul. 2, 1992, now abandoned.

The present invention relates to a photosensitive composition. More particularly, it relates to a photosensitive composition, which is to be coated on a support and to be developed with an alkali developing solution after exposure for forming an image.

In recent years, various studies have been made in the application field employing photosensitive compositions. For example, there may be mentioned photosensitive layers for printing plates such as a planograph, a letterpress, a plano-concave plate and an intaglio, or photoresists useful for the preparation of electronic circuits such as LSI and printed circuit boards.

In each of such applications, a photosensitive composition is coated on a support or substrate and then usually subjected to exposure for forming an image, whereupon the exposed portion or the non-exposed portion is removed by a developing solution to form the image.

As the developing solution used here, an aqueous alkali developing solution and an organic solvent type developing solution are known. In recent years, attention has been drawn to the alkali developing type developer from the viewpoint of the safety and hygiene of the working environment. However, the alkali-developability is determined primarily by the nature of the binder polymer. As a method of letting a binder polymer have alkali developability, it is known to copolymerize a monomer containing a carboxylic acid group or to introduce a carboxylic acid into a polymer by reacting hydroxyl groups of a polyvinyl alcohol with a cyclic acid anhydride such as phthalic anhydride.

However, a binder polymer having a carboxylic acid intoduced thereinto, tends to be poor in the resistance against a stress or in the adhesion to a support. Therefore, various studies have been made to improve the composition of the copolymer or the backbone structure of the polymer itself. However, no satisfactory results have been obtained, and further improvements are desired.

The present inventors have conducted extensive studies and as a result, have found it possible to solve such a problem by using a photosensitive material and a copolymer comprising certain specific structural units, as the binder polymer. The present invention has been accomplished on the basis of this discovery.

It is therefore the object of the present invention to provide a photosensitive composition capable of being developed with an alkali developing solution, which is excellent in the mechanical properties and in the sensitivity and which is further excellent in the adhesion to the support.

Such an object can be readily attained by a photosensitive composition comprising a photosensitive material and a polymer comprising structural units of the following formula (I):

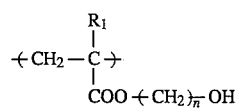

wherein $R_1$ is a hydrogen atom or a methyl group, and n is an integer of from 3 to 10.

More specifically, the present invention provides a photosensitive composition comprising a photosensitive material and a polymer, wherein the polymer comprises from 2 to 50 mol % of hydroxyalkyl (meth)acrylate units, of which the main component is units of a hydroxyalkyl (meth)acrylate of the above formula (I).

Now, the present invention will be described in detail with reference to the preferred embodiments.

In the present invention, any conventional photosensitive material may be used as the photosensitive material. However, the photosensitive material will be described with respect to a diazo resin, as a typical example.

As the diazo resin, a conventional product may suitably be used. It includes a diazo resin represented by a condensation product of an aromatic diazonium salt with e.g. an active carbonyl-containing compound, particularly formaldehyde. As such resin, a diazo resin soluble in an organic solvent is preferred.

The diazo resin may further be an inorganic salt of a diazo resin, which is an orgainic solvent-soluble reaction product of e.g. a condensation product of p-diazodiphenylamine and formaldehyde or acetaldehyde, with hexafluorophosphate or tetrafluoroborate, or an organic solvent-soluble organic acid salt of a diazo resin, which is a reaction product of the above condensation product with a sulfonic acid such as p-toluenesulfonic acid or its salt, with a phosphine acid such as benzenephosphine acid or its salt, or with a hydroxyl-containing compound such as 2,4-dihydroxybenzophenone, 2-hydroxy-4-methoxybenzophenone-5-sulfonic acid or its salt, as disclosed in U.S. Pat. No. 3,300,309.

Further, another diazo resin useful in the present invention is a (co)condensation product comprising, as structural units, an aromatic compound having at least one carboxyl group and/or at least one hydroxyl group, and a diazonium compound, preferably an aromatic diazonium compound. The aromatic compound having at least one carboxyl group and/or at least one hydroxyl group is the one which contains in its molecule an aromatic ring substituted by at least one carboxyl group and/or an aromatic ring substituted by at least one hydroxyl group. In this case, the carboxyl group and the hydroxyl group may be substituted on the same aromatic ring. The aromatic ring is preferably an aryl group such as a phenyl group or a naphthyl group. Further, the carboxyl group or the hydroxyl group may be bonded directly to the aromatic ring or may be bonded via a connecting group to the aromatic ring.

In the above case, the number of carboxyl groups bonded to one aromatic ring is preferably 1 or 2. Likewise, the number of hydroxyl groups bonded to one aromatic ring is preferably from 1 to 3. Further, as the connecting group, an alkylene group having from 1 to 4 carbon atoms may, for example, be mentioned.

Specific examples of the aromatic compound having at least one carboxyl group and/or at least one hydroxyl group, include benzoic acid, (o, m or p)-chlorobenzoic acid, phthalic acid, terephthalic acid, diphenylacetic acid, phenoxyacetic acid, p-methoxyphenylacetic acid, p-methoxybenzoic acid, 2,4-dimethoxybenzoic acid, 2,4-dimethylbenzoic acid, p-phenoxybenzoic acid, 4-anilinobenzoic acid, 4-(m-methoxyanilino)benzoic acid, 4-(p-methoxybenzoyl)benzoic acid, 4-(p-methylanilino)benzoic acid, 4-phenylsulofonylbenzoic acid, phenol, (o, m or p)-cresol, xylenol, resorcinol, 2-methylresorcinol, (o, m or p)-methoxyphenol, m-ethoxyphenol, catechol, fluoroglycine, p-hydroxyethylphenol, naphthol, pyrogallol, hydroquinone, p-hydroxybenzyl alcohol, 4-chlororesorcine, biphenyl-4,4'-diol, 1,2,4-benzenetriol, bisphenol A, 2,4-dihydroxybenzophenone, 2,3,4-trihydroxybenzophenone, p-hydroxyacetophenone, 4,4-dihydroxydiphenyl ether, 4,4'-dihydroxydiphenylamine, 4,4'-dihydroxydiphenyl sulfidecumylphenol, (o, m or p)-chlorophenol, (o, m or p)-bromophenol, salicylic acid, 4-methylsalicylic acid, 6-methylsalicylic acid, 4-ethylsalicylic acid, 6-propylsalicylic acid, 6-laurylsalicylic acid, 6-stearylsalicylic acid, 4,6-dimethylsalicylic acid, p-hydroxybenzoic acid, 2-methyl-4-hydroxybenzoic acid, 6-methyl-4-hydroxybenzoic acid, 2,6-dimethyl-4-hydroxybenzoic acid, 2,4-dihydroxybenzoic acid, 2,4-dihydroxy-6-methylbenzoic acid, 2,6-dihydroxybenzoic acid, 2,6-dihydroxy-4-methylbenzoic acid, 4-chloro-2,6-dihydroxybenzoic acid, 4-methoxy-2,6-dioxybenzoic acid, gallic acid, fluoroglycine carboxylic acid, 2,4,5-trihydroxybenzoic acid, m-galloylgallic acid, tannic acid, m-benzoylgallic acid, m-(p-toluyl)gallic acid, protocatechuoyl-gallic acid, 4,6-dihydroxyphthalic acid, (2,4-dihydroxyphenyl)acetic acid, (2,4-dihydroxyphenyl)acetic acid, (3,4,5-trihydroxyphenyl)acetic acid, p-hydroxymethylbenzoic acid, p-hydroxyethylbenzoic acid, 4-(p-hydroxyphenyl)methylbenzoic acid, 4-(o-hydroxybenzoyl)benzoic acid, 4-(2,4-dihydroxybenzoyl)benzoic acid, 4-(p-hydroxyphenoxy)benzoic acid, 4-(p-hydroxyanilino)benzoic acid, bis(3-carboxy-4-hydroxyphenyl)amine, 4-(p-hydroxyphenylsulfonyl)benzoic acid, and 4-(p-hydroxyphenylthio)benzoic acid. Among them, particularly preferred are salicylic acid, p-hydroxybenzoic acid, p-methoxybenzoic acid and m-chlorobenzoic acid.

As the aromatic diazonium compound constituting structural units of the above co-condensed diazo resin, diazonium salts as disclosed in Japanese Examined Patent Publication No. 48001/1974, may, for example, be employed. Particularly preferred are diphenylamine-4-diazonium salts.

The diphenylamine-4-diazonium salts are produced from 4-amino-diphenylamines. Such 4-amino-diphenylamines include, for example, 4-amino-diphenylamine, 4-amino-3-methoxy-diphenylamine, 4-amino-2-methoxy-diphenylamine, 4'-amino-2-methoxy-diphenylamine, 4'-amino-4-methoxydiphenylamine, 4-amino-3-methyldiphenylamine, 4-amino-3-ethoxy-diphenylamine, 4-amino-3-β-hydroxyethoxydiphenylamine, 4-amino-diphenylamine-2-sulfonic acid, 4-amino-diphenylamine-2-carboxylic acid and 4-amino-diphenylamine-2'-carboxylic acid. Particularly preferred are 3-methoxy-4-amino-diphenylamine and 4-amino-diphenylamine.

The above mentioned co-condensed diazo resin can be prepared by a conventional method, for example, by polycondensing the diazonium salt, the aromatic compound having a carboxyl group and/or a hydroxyl group, and an aldehyde such as paraformaldehyde, acetaldehyde or benzaldehyde, or a ketone such as acetone or acetophenone, in sulfuric acid, phosphoric acid or hydrochloric acid, in accordance with the methods disclosed in e.g. Photo. Sci., Eng., Vol. 17, p33 (1973), and U.S. Pat. Nos. 2,063,631 and 2,679,498.

The aromatic compound having a carboxyl group and/or a hydroxyl group in its molecule, the aromatic diazo compound and the aldehyde or the ketone, may mutually be freely combined. Further, two or more different types of the respective reactants may be used for co-condensation.

The molar ratio of the aromatic compound having at least one carboxyl group and/or at least hydroxyl group to the aromatic diazo compound is usually from 1:0.1 to 0.1:1, preferably from 1:0.5 to 0.1:1, more preferably from 1:1 to 0.15:1. Further, in this case, the molar ratio of the total amount of the aromatic compound having at least one carboxyl group and/or at least one hydroxyl group and the aromatic diazo compound to the amount of the aldehyde or the ketone, is usually from 1:0.6 to 1:1.2, preferably from 1:0.7 to 1:1.5, and the co-condensation diazo resin is obtainable by reacting at a low temperature for a short period of time at a level of 3 hours.

The counter anion for the diazo resin to be used in the present invention includes anions which are capable of forming stable salts with the diazo resin and capable of making the resin soluble in an organic solvent. Such counter anions include organic carboxylic acids such as decanoic acid and benzoic acid, organic phosphoric acids such as phenyl phosphoric acid and sulfonic acids. Typical examples include aliphatic and aromatic sulfonic acids such as methane sulfonic acid, chloroethane sulfonic acid, dodecane sulfonic acid, benzene sulfonic acid, toluene sulfonic acid, mesitylene sulfonic acid, anthraquinone sulfonic acid, 2-hydroxy-4-methoxybenzophenone-5-sulfonic acid, hydroxysulfonic acid, 4-acetylbenzenesulfonic acid and dimethyl-5-sulfoisophthalate, hydroxyl-containing aromatic compounds such as 2,2',4,4'-tetrahydroxybenzophenone, 1,2,3-trihydroxybenzophenone and 2,2',4-trihydroxybenzophenone, halogenated Lewis acids such as hexafluorophosphoric acid and tetrafluoroboric acid, and perhalo acids such as $ClO_4$ or $IO_4$. However, useful anions are not limited to such specific examples. Among them, particularly preferred are hexafluorophosphoric acid, tetrafluoroboric acid and 2-hydroxy-4-methoxybenzophenone-5-sulfonic acid.

The above co-condensation diazo resin can be prepared to have an optional molecular weight by adjusting the condensation conditions and the molar ratio of the respective monomers. To be useful for the purpose of the present invention, the diazo resin having a molecular weight of from about 400 to 10,000 may be employed, but the one having a molecular weight of from 800 to 5,000 is preferred.

The proportion of the diazo resin in the photosensitive composition of the present invention is usually from 1 to 70% by weight, preferably from 3 to 60% by weight.

Now, the polymerizable ethylenically unsaturated monomer which can be used together with or in place of the diazo resin, as the photosensitive material of the present invention, will be described. Such a polymerizable ethylenically unsaturated monomer is not particularly limited so long as it shows a chain polymerization reaction against free radicals. Here, the term "monomer" is used to represent a concept against a so-called a polymer material. Accordingly, it includes not only a monomer in a narrow sense but also a dimer, a trimer and an oligomer.

Such a polymerizable ethylenically unsaturated monomer may, for example, be an unsaturated carboxylic acid; an ester of an aliphatic polyhydroxy compound with an unsaturated carboxylic acid; an ester of an aromatic polyhydroxy compound with an unsaturated carboxylic acid; or an ester obtained by an esterification reaction of an unsaturated carboxylic acid and a polybasic carboxylic acid with a polyhydric hydroxy compound such as the above-mentioned aliphatic polyhydroxy compound or aromatic polyhydroxy compound.

Specific examples of the above-mentioned ester of an aliphatic polyhydroxy compound with an unsaturated carboxylic acid, include acrylates such as ethylene glycol diacrylate, triethylene glycol diacrylate, trimethylolpropane triacrylate, trimethylolethane triacrylate, pentaerythritol diacrylate, pentaerythritol triacrylate, pentaerythritol tetracrylate, dipentaerythritol tetracrylate, dipentaerythritol pentacrylate, dipentarythritol hexacrylate and glycerol acrylate, and the corresponding methacrylates, itaconates, crotonates and maleates.

As the ester of an aromatic polyhydroxy compound with an unsaturated carboxylic acid, hydroquinone diacrylate, hydroquinone dimethacrylate, resorcinol diacrylate, resorcinol dimethacrylate or pyrogallol triacrylate, may, for example, be mentioned.

The ester obtained by the esterification reaction of an unsaturated carboxylic acid and a polybasic carboxylic acid with polyhydric hydroxy compound, may not necessarily be a single product. Typical examples may be a condensation product of acrylic acid, phthalic acid and ethylene glycol, a condensation product of acrylic acid, maleic acid and diethylene glycol, a condensation product of methacrylic acid, terephthalic acid and pentaerythritol, and a condensation product of acrylic acid, adipic acid, butanediol and glycerol.

Other examples of the ethylenically unsaturated monomer useful in the present invention include a urethane acrylate such as an addition reaction product of toluene diisocyanate with hydroxyethyl acrylate; an epoxy acrylate such as an addition reaction product of a diepoxy compound with a hydroxyethyl acrylate; an acrylamide such as ethylene bisacrylamide; an allyl ester such as diallyl phthalate; and a vinyl group-containing compound such as divinyl phthalate.

Among these, an acrylate or methacrylate monomer is particularly useful.

The proportion of the ethylenically unsaturated monomer in the photosensitive composition of the present invention is usually from 5 to 90 parts by weight, preferably from 10 to 50 parts by weight, per 100 parts by weight of the composition.

As the photopolymerization initiator, a conventional initiator may be used. For example, benzoin, benzoin alkyl ether, benzophenone, anthraquinone, benzyl, Michler's ketone or a complex system of biimidazole and Michler's ketone, may suitably be used.

The amount of the photopolymerization initiator in the photosensitive composition is usually from 0.1 to 20% by weight, preferably from 0.2 to 10% by weight.

Now, the polymer contained in the photosensitive composition together with the diazo compound and/or the polymerizable ethylenically unsaturated monomer, and the photopolymerization initiator, will be described.

The polymer to be used in the present invention is a polymer composed mainly of structural units of the above formula (I), and it is particularly preferably a copolymer. That is, a copolymer is preferred in which the proportion of the structural units of the formula (I) is from 2 to 50 mol %, preferably from 3 to 45 mol %, more preferably from 5 to 40 mol %. Now, monomers useful as the starting material for the structural units of the formula (I) will be described. These monomers are represented by the structure of the following formula (II):

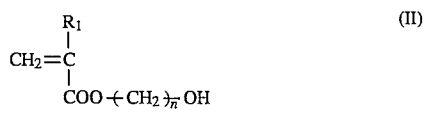

(II)

wherein $R_1$ is a hydrogen atom or a methyl group, and n is an integer of from 3 to 10.

Such monomers have a characteristic such that when formed into copolymers, as the number of n in the formula (I) increases, the abrasion resistance improves, the modulus of elasticity decreases and the flexibility improves, as compared with the one wherein n is 2 or less (such as 2-hydroxyethyl methacrylate where n=2 and $R_1=CH_3$). Accordingly, when the copolymers are applied to photosensitive compositions, the resistance to stress improves or the adhesion to the support improves, as the number of n increases.

However, if the number of n is too large, the melting point of the copolymer tends to be so low that the handling efficiency tends to be poor. In view of the balance with other properties (particularly the chemical resistance and sensitivity) when applied to the photosensitive composition, n useful in the present invention is an integer within a range of from 3 to 10, more preferably 4, 5 or 6, most preferably 4. Specific examples of such a monomer include 4-hydroxybutyl (meth)acrylate, 5-hydroxypentyl (meth)acrylate and 6-hydroxyhexyl (meth)acrylate.

The above monomers may readily be prepared by conventional methods. The conventional methods include those disclosed in e.g. German Patent 1518572, Japanese Unexamined Patent Publications No. 083320/1975 and No. 237791/1988, German Patent 2027444 and UK Patent 832493.

The copolymer as a preferred example of the polymer of the present invention, can be obtained by copolymerizing an addition polymerizable unsaturated compound to the above monomer. The addition polymerizable unsaturated compound is selected from compounds having addition polymerizable unsaturated bonds, such as (meth)acrylic acids, (meth)acrylamides, (meth)acrylates, vinyl ethers, vinyl ketones, styrenes and olefins.

Specifically, those identified in the following items (1) to (9) may be mentioned.

(1) (Meth)acrylamides such as (meth)acrylamide, N-methylol (meth)acrylamide, N-ethylacrylamide, N-hexylacrylamide, N-cyclohexylacrylamide, N-hydroxyethylacrylamide, N-phenylacrylamide, N-nitrophenylacrylamide, N-ethyl-N-phenylacrylamide.

(2) (Substituted)alkyl (meth)acrylates such as methyl (meth)acrylate, ethyl (meth)acrylate, propyl (meth)acrylate, butyl (meth)acrylate, amyl (meth)acrylate, hexyl (meth)acrylate, octyl (meth)acrylate, 2-chloroethyl (meth)acrylate, 2-hydroxyethyl (meth)acrylate, glycidyl (meth)acrylate, N-dimethylaminoethyl (meth)acrylate, and cyclohexyl (meth)acrylate.

(3) Vinyl ethers such as ethyl vinyl ether, 2-chloroethylvinyl ether, hydroxyethylvinyl ether propylvinyl ether, butylvinyl ether, octylvinyl ether, and phenylvinyl ether.

(4) Vinyl esters such as vinyl acetate, vinyl chloroacetate, vinyl butyrate, and vinyl benzoate.

(5) Styrenes such as styrene, α-methylstyrene, methylstyrene, and chloromethylstyrene.

(6) Vinyl ketones such as methylvinyl ketone, ethylvinyl ketone, propylvinyl ketone, and phenylvinyl ketone.

(7) Olefins such as ethylene, propylene, isobutylene, butadiene, and isoprene.

(8) N-vinylpyrrolidone, N-vinylcarbatol, 4-vinylpyridine, and (meth)acrylonitrile.

(9) (Meth)acrylic acid.

The addition polymerizable unsaturated compound is not limited to such specific examples, and other unsaturated compounds may be used so long as they are copolymerizable with the monomer of the above formula (II). Particularly preferred addition polymerizable unsaturated compounds among them are ethyl (meth)acrylate, methyl (meth)acrylate, acrylonitrile, and methacrylic acid. Such a vinyl polymer is incorporated in an amount of from 30 to 99% by weight, preferably from 40 to 97% by weight, to the photosensitive composition.

To the photosensitive composition of the present invention, a dye, a pigment, a coating property-improving agent, a plasticizer or a stabilizer, may, for example, be added, as the case requires, in addition to the materials as described above.

The dye may be a coloring matter of triphenylmethane type, diphenylmethane type, oxadine type, xanthane type, iminonaphthoquinone type, azomethine type or anthracene type, represented by e.g. "Victoria Pure Blue-BOH" (manufactured by Hodogaya Chemical Company Ltd.), "Oil Blue #603" (manufactured by Olient Chemical Company Limited), "Patent Pure Blue" (manufactured by Sumitomo Mikuni Kagaku K.K.), "Crystal Violet", "Brilliant Green", "Ethyl Violet", "Methyl Green", "Erythrocine B", "Basic Fuchsine", "Malachite Green", "Oil Red", "M-cresol Purple", "Rhodamine B", "Auramine", A-p-diethylaminophenyliminonaphthoquinone, or cyano-p-diethylaminophenylacetoanilide.

The dye is preferably incorporated in an amount of from about 0.5 to about 10% by weight, particularly from about 1 to about 5% by weight, to the photosensitive composition.

The coating property-improving agent may be an alkyl ether (such as ethyl cellulose or methyl cellulose), a carbitol (such as methylcarbitol or ethylcarbitol), a fluorine-type surfactant or a nonionic surfactant [such as "Pluronic L-64" (manufactured by Asahi Denka K.K.)]. As a plasticizer to impart flexibility and abrasion resistance to the coating film, butylphthalate, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, or an oligomer of acrylic acid or methacrylic acid, may, for example, be mentioned. As the stabilizer, polyacrylic acid, tartaric acid, phosphoric acid, phosphorous acid, or an organic acid (such as acrylic acid, methacrylic acid, citric acid, oxalic acid, benzenesulfonic acid, naphthalene sulfonic acid, or 4-methoxy-2-hydroxybenzophenone-5-sulfonic acid) may be mentioned. As a development accelerator, a higher alcohol or an acid anhydride may also be mentioned. The amounts of these additives vary depending upon the purpose of their use. Usually, they are preferably from 0.01 to 30% by weight, relative to the total solid content.

The photosensitive composition of the present invention is dissolved in a solvent capable of dissolving the above-mentioned various components, and the solution is coated and dried on the surface of a support to form e.g. a photosensitive planographic material or a photoresist (for e.g. a resin letterpress material or a printed circuit board). The solvent useful for this purpose may, for example, be a cellosolve such as methylcellosolve acetate, ethylcellosolve or ethylcellosolve acetate, dimethylformamide, dimethylsulfoxide, dioxane, acetone, cyclohexanone, trichloroethylene, methyl ethyl ketone, methylcarbitol, or methyl lactate. These solvents may be used alone or in combination as a mixture of two or more of them.

The form of the photosensitive material prepared by using the photosensitive composition of the present invention, may be suitably selected depending upon the particular purpose. For example, as diluted with a proper solvent or without solvent, it may be coated and dried on a sheet such as a polymer sheet, a paper sheet or a metal sheet, and if necessary, an overcoat layer or a polymer sheet layer to shut off oxygen, may be formed thereon, as a case requires. Otherwise, the photosensitive composition may be encapsulated in microcapsules, which may then be coated on a sheet. Or, a liquid photosensitive resin may be used as it is. Thus, various forms are available for selection.

The light source for exposure useful for the photosensitive composition of the present invention is not particularly limited. However, a carbon arc, a high pressure mercury lamp, a xenon lamp, a metal halide lamp, a fluorescent lamp, a tungsten lamp, a halogen lamp, a helium cadmium laser, an argon ion laser or a helium neon laser may, for example, be particularly preferably used.

Now, the present invention will be described in further detail with reference to Examples and Comparative Examples. However, it should be understood that the present invention is by no means restricted to such specific Examples.

Preparation of Copolymer 1

Under a nitrogen stream, 3.2 g of 4-hydroxybutyl acrylate (4 HBA), 6.4 g of methyl methacrylate (MMA), 7.2 g of acrylonitrile (AN), 4.8 g of methyl acrylate (MA), 15.6 g of ethyl acrylate (EA), 2.8 g of methacrylic acid and 0.9 g of azobisisobutyronitrile were dissolved in a solvent mixture comprising 24 g of acetone and 24 g of methanol, and the solution was refluxed at 60° C. for 6 hours under stirring. After completion of the reaction, the reaction solution was poured into water to precipitate the polymer. The copolymer was collected by filtration and vacuum-dried at 60° C. for about three days.

Preparation of Copolymers 2 to 6

Copolymers 3, 4 and 6 are Comparative Examples

In the same manner as above, copolymers 2 to 6 were prepared. The monomer compositions of the respective copolymers are shown in Table 1.

TABLE 1

| Copolymer No. | Monomer composition (wt %) |
|---|---|
| 1 | 4HBA/MMA/AN/MA/EA/MAA |
|   | 8  16  18 12 39  7 |
| 2 | 4HBA/MMA/AN/MAA |
|   | 10  62  20  8 |
| 3 | AN/MMA/MAA |
|   | 30 60  10 |
| 4 | HEMA/MMA/MAA |
|   | 85  10  5 |
| 5 | 4HBA/HEMA/AN/EA/MAA |
|   | 25  5  30 30  10 |
| 6 | 4HBA/HEMA/AN/EA/MAA |
|   | 5  25 30 30  10 |

*4HBA: 4-hydroxybutyl acrylate
MMA: methyl methacrylate, AN: acrylonitrile
MA: methyl acrylate, EA; ethyl acrylate
MMA: methacrylic acid, HEMA: 2-hydroxyethyl methacrylate Preparation of Diazo Resin 1

3.5 g (25 mmol) of p-hydroxybenzoic acid and 21.75 g (75 mmol) of p-diazodiphenylamine sulfate were dissolved in 90 g of concentrated sulfuric acid under cooling with ice. To this solution, 2.7 g (90 mmol) of paraformaldehyde was slowly added so that the reaction temperature would not exceed 10° C. The reaction solution was stirred for two hours and then dropwise added to 1 l of ethanol. The formed precipitate was collected by filtration and washed with ethanol. The precipitate was dissolved in 200 ml of pure water, and an aqueous solution having 10.5 g of zinc chloride dissolved therein, was added thereto. The formed precipitate was collected by filtration, washed with ethanol and then dissolved in 300 ml of pure water. To this solution, an aqueous solution having 13.7 g of ammonium hexafluorophosphate dissolved therein, was added. The formed precipitate was collected by filtration, washed with water and ethanol and then dried at 25° C. for one day to obtain diazo resin 1.

EXAMPLES 1 TO 4 AND COMPARATIVE EXAMPLES 1 TO 4

Each photosensitive composition was applied to a photosensitive planographic plate, and the alkali developability and the printing resistance were examined.

Preparation of the Planographic Aluminum Plate

An aluminum plate was degreased with a 3% sodium hydroxide aqueous solution, then subjected to electrolytic etching at 25° C. at a current density of 30 A/dm$^2$ in a 2% hydrochloric acid bath, washed with water and then subjected to anodizing treatment at 30° C. for two minutes at a current density of 6.0 A/dm$^2$ in a 30% sulfuric acid bath.

Then, it was subjected to pore-sealing treatment with a 1% sodium metasilicate aqueous solution at 85° C. for 30 seconds, then washed with water and dried to obtain a photosensitive planographic aluminum plate.

On the aluminum plate thus prepared by the above process, a photosensitive solution having the composition as identified in Table 2 (a solution having a solid concentration of 10% by weight in methylcellosolve, manufactured by Junsei Kagaku K.K.) was coated by means of a wire bar coater, so that the weight of the coating film after drying would be 20 mg/dm$^2$.

In the cases of Examples 3 and 4 and Comparative Examples 3 and 4, a photopolymerization initiator was employed, and therefore, a polyvinyl alcohol aqueous solution was applied on the photosensitive layer thus prepared, by means of a wire bar to form an overcoat layer with a thickness after drying of 3 μm.

A negative original film was placed on each test sample thus obtained (each of test samples of Examples 1 to 4 and Comparative Examples 1 to 4) and brought in close contact under vacuum, and then exposure was conducted for 30 seconds from a distance of 100 cm by means of a metal halide lamp of 2 kW. Then, the sample was immersed in an alkali developing solution having the following compositions, at 27° C. for 20 seconds and then while washing with water, gently rubbed by absorbent cotton for development.

| Developing solution | |
|---|---|
| Potassium silicate | 1160 g |
| 50% potassium hydroxide | 266 g |
| Water | 6430 g |
| pH (at 25° C.) | 12.8 |

Each test sample thus obtained was used for printing by "Hydelberg GTO" printing machine, whereupon the printing resistance against an alkaline moistening water used for e.g. printing newspapers, and smear at non-image line portions, as an index of the alkaline water developability, were examined.

The results are shown in Table 2.

TABLE 2

| | Compositions (parts by weight) and test results | | | | | | | |
|---|---|---|---|---|---|---|---|---|
| | Examples | | | | Comparative Examples | | | |
| | 1 | 2 | 3 | 4 | 1 | 2 | 3 | 4 |
| Copolymer 1 | 100 | — | 100 | — | — | — | — | — |
| Copolymer 2 | — | 100 | — | 100 | — | — | — | — |
| Copolymer 3 | — | — | — | — | 100 | — | 100 | — |
| Copolymer 4 | — | — | — | — | — | 100 | — | 100 |
| Copolymer 5 | — | — | — | — | — | — | — | — |
| Copolymer 6 | — | — | — | — | — | — | — | — |
| Diazo resin 1 | 10 | 10 | — | — | 10 | 10 | — | — |
| DETX[1] | — | — | 3 | 3 | — | — | 3 | 3 |
| EPA[2] | — | — | 3 | 3 | — | — | 3 | 3 |
| PETA[3] | — | — | 50 | 50 | — | — | 50 | 50 |
| Dye[4] | 3 | 3 | 3 | 3 | 3 | 3 | 3 | 3 |
| Developability[5] | Good | Good | Good | Good | Slightly poor | Slightly poor | Poor | Poor |
| Printing resistance[6] | High | High | High | High | Medium | Medium | Low | Low |

[1]DETX:

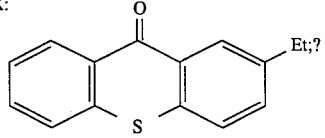

manufactured by Nippon Kayaku Co., Ltd.

[2]EPA:

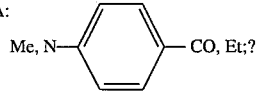

manufactured by Nippon Kayaku Co., Ltd.?
[3]PETA: pentaerythritol triacrylate monomer (Biscoat #300); manufactured by Osaka Yuki K.K.
[4]Dye: "Victoria Pure Blue-BOH"; manufactured by Haodogaya Chemical Co., Ltd.
[5]Developability
Good: No smear was observed at non-image line portions.
Poor: Smear was observed at non-image line portions.
[6]Printing resistance
High: Printing resistance against more than 100,000 sheets
Medium: From 60,000 to 100,000 sheets
Low: Less than 60,000 sheets The excellent printing resistance of a photosensitive planographic plate means that the photosensitive composition used is excellent in the mechanical properties and the adhesion to the support.

EXAMPLE 5 AND COMPARATIVE EXAMPLE 5

On the aluminum plate thus prepared by the above process, a photosensitive solution having the composition as identified in Table 4 (a solution having a solid concentration of 10% by weight in methylcellosolve, manufactured by Junsei Kagaku K.K.) was coated by means of a wire bar coater, so that the weight of the coating film after drying would be 15 mg/dm$^2$.

TABLE 4

| Composition (parts by weight) of Example 5 | |
| --- | --- |
| Copolymer 5 | 100 parts |
| Diazo resin | 9 parts |
| Polyacrylic acid | 6 parts |
| Dye ("Victoria Pure Blue-BOH", manufactured by Hodogaya Chemical Co., Ltd.) | 2 parts |

In Comparative Example 5, the composition was the same as the composition in Example 5 except that copolymer 6 was used instead of copolymer 5.

On each of the test samples thus obtained, a stepped tablet (manufactured by Konica Company Ltd.) designed so that the quantity of light decreases by $1/=\overline{2}$ every step, was closely contacted, and exposure was conducted at 300 mJ/cm$^2$, followed by development by means of an automatic developing machine, manufactured by Dainippon Screen K.K., whereupon the sensitivity was evaluated, and the number of steps was 5.9 steps in Example 5 and 4.6 steps in Comparative Example 5. For the development, the automatic developing machine was set so that each test sample was immersed in the developing solution "SDN-21" (manufactured by Konica Company Ltd.), at 25° C. for 20 seconds.

As is evident from the above results, the photosensitive compositions of the present invention have excellent alkali developability, and they are excellent also in the mechanical properties, sensitivity and adhesion to the support.

We claim:

1. A photosensitive composition for photosensitive planographic plates, comprising:

a diazo compound and a polymer, wherein the polymer comprises from 3 to 45 mol % of units of 4-hydroxybutyl(meth) acrylate.

2. A photosensitive composition for photosensitive planographic plates comprising:

a diazo compound and a polymer which consists of from 3 to 45 mol % of units of 4-hydroxybutyl (meth)acrylate and optionally at least one monomer selected from the group consisting of (meth)acrylamides, methyl(meth)acrylate, ethyl(meth)acrylate, propyl(meth)acrylate, butyl(meth)acrylate, amyl(meth)acrylate, hexyl(meth)acrylate, octyl(meth)acrylate, 2-chloroethyl(meth)acrylate, 2-hydroxyethyl(meth)acrylate, glycidyl(meth)acrylate, N,N-dimethylaminoethyl(meth)acrylate, cyclohexyl(meth)acrylate, vinyl ethers, vinyl esters, styrenic compounds, vinyl ketones, olefins, N-vinylpyrrolidone, N-vinylcarbazol, 4-vinylpyridine, (meth)acrylonitrile and (meth)acrylic acid.

3. The photosensitive composition according to claims 1–8, wherein the polymer comprises from 5 to 40 mol % of the hydroxybutyl (meth)acrylate units.

4. The photosensitive composition according to claim 3–8, wherein the polymer comprises from 20 to 70 mol % of units of an alkyl (meth)acrylate of the following formula (III):

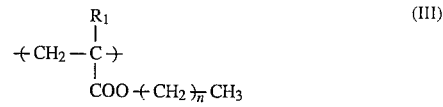

wherein $R_1$ is a hydrogen atom or a methyl group, and n is an integer of from 0 to 3, from 5 to 40 mol % of units of acrylonitrile, from 2 to 10 mol % of units of (meth)acrylic acid, and from 2 to 50 mol % of units of 4-hydroxybutyl (meth)acrylate.

* * * * *